United States Patent
Lee et al.

(10) Patent No.: US 10,225,026 B2
(45) Date of Patent: Mar. 5, 2019

(54) SYSTEM FOR PISTON ROD MONITORING

(71) Applicant: General Electric Company, Schenectady, NY (US)

(72) Inventors: Yongjae Lee, Latham, NY (US); Joseph Alfred Iannotti, Glenville, NY (US); Filippo Gerbi, Prato (IT); Alessio Capanni, Arezzo (IT)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 181 days.

(21) Appl. No.: 15/193,621

(22) Filed: Jun. 27, 2016

(65) Prior Publication Data
US 2017/0373766 A1   Dec. 28, 2017

(51) Int. Cl.
*G01R 29/10* (2006.01)
*H04B 17/10* (2015.01)
(Continued)

(52) U.S. Cl.
CPC ........... *H04B 17/103* (2015.01); *F02D 41/22* (2013.01); *F02F 3/00* (2013.01); *F04B 1/0408* (2013.01);
(Continued)

(58) Field of Classification Search
CPC ........ G08C 17/00; G01B 7/023; H01Q 9/065; H01Q 9/0407; H04B 17/103; F04B 53/144; G01R 29/10
(Continued)

(56) References Cited

U.S. PATENT DOCUMENTS 5,459,397 A   10/1995   Spillman, Jr.
5,710,375 A   1/1998   Roger
(Continued)

FOREIGN PATENT DOCUMENTS

CN   102252790 B   11/2012
CN   104483219 A   4/2015
(Continued)

OTHER PUBLICATIONS

Hwward, Brian, "Wireless Connecting Rod Temperature Measurements for Reciprocating Compressor Monitoring", GE Energy GER-4606 (Jun. 2010), 12 pages.
(Continued)

*Primary Examiner* — Hai V Tran
(74) *Attorney, Agent, or Firm* — GE Global Patent Operation; Pabitra Chakrabarti

(57) ABSTRACT

A sensor system for determining a condition associated with a piston rod of a reciprocating system includes an interrogator system having a first antenna. The sensor system further includes a second antenna separated from the first antenna by an air gap distance. The second antenna is configured to be coupled to the piston rod of the reciprocating system. The second antenna is a patch antenna and is configured to communicate with the first antenna through a range of translational movement relative to the first antenna. The sensor system further includes a radio frequency sensor coupled to the second antenna. The radio frequency sensor is configured to be coupled to the piston rod of the reciprocating system, measure a characteristic associated with the piston rod of the reciprocating system, and transmit data associated with the characteristic to the first antenna of the interrogator system through the second antenna.

20 Claims, 5 Drawing Sheets

(51) Int. Cl.
*G08C 17/00* (2006.01)
*F02D 41/22* (2006.01)
*F02F 3/00* (2006.01)
*F04B 49/20* (2006.01)
*F04B 51/00* (2006.01)
*F04B 53/14* (2006.01)
*H01Q 9/04* (2006.01)
*H01Q 9/06* (2006.01)
*F04B 1/04* (2006.01)
*H04Q 9/00* (2006.01)
*F04B 27/04* (2006.01)
*F04B 39/00* (2006.01)
*F04B 1/053* (2006.01)
*F04B 27/053* (2006.01)

(52) U.S. Cl.
CPC ...... *F04B 27/0409* (2013.01); *F04B 39/0022* (2013.01); *F04B 49/20* (2013.01); *F04B 51/00* (2013.01); *F04B 53/144* (2013.01); *G01R 29/10* (2013.01); *G08C 17/00* (2013.01); *H01Q 9/0407* (2013.01); *H01Q 9/065* (2013.01); *H04Q 9/00* (2013.01); *F04B 1/053* (2013.01); *F04B 27/053* (2013.01); *F04B 2201/0204* (2013.01); *F04B 2201/1201* (2013.01); *H04Q 2209/886* (2013.01)

(58) Field of Classification Search
USPC ............. 340/870.01, 870.3; 342/42; 343/703
See application file for complete search history.

(56) References Cited

U.S. PATENT DOCUMENTS

| | | | |
|---|---|---|---|
| 6,318,147 B1 | 11/2001 | Steinruck et al. | |
| 6,999,000 B2 | 2/2006 | Campbell et al. | |
| 7,186,094 B2 | 3/2007 | Edlund et al. | |
| 7,492,280 B2* | 2/2009 | Horler | G08C 17/04 340/539.1 |
| 7,555,370 B2 | 6/2009 | Breed et al. | |
| 7,882,789 B2 | 2/2011 | Kumar et al. | |
| 7,975,554 B2 | 7/2011 | Berkcan et al. | |
| 8,223,036 B2 | 7/2012 | Mitchell et al. | |
| 2002/0011099 A1 | 1/2002 | Domens et al. | |
| 2003/0020480 A1 | 1/2003 | Maylotte et al. | |
| 2000/4001729 | 1/2004 | Campbell et al. | |
| 2005/0274799 A1* | 12/2005 | Torchalski | B41J 3/4075 235/432 |
| 2007/0068278 A1* | 3/2007 | Liu | G01L 9/0022 73/862 |
| 2007/0115116 A1 | 5/2007 | Zabek | |
| 2009/0167503 A1 | 7/2009 | Cook et al. | |
| 2013/0312533 A1 | 11/2013 | Berkcan et al. | |
| 2013/0332011 A1 | 12/2013 | Ziarno | |
| 2013/0332025 A1 | 12/2013 | Ziarno | |
| 2015/0312654 A1* | 10/2015 | Lee | H01Q 21/065 340/870.07 |

FOREIGN PATENT DOCUMENTS

WO 2005/108744 A1 11/2005
WO 2012079759 A1 6/2012

OTHER PUBLICATIONS

"Connecting Rod Wireless Strain Measurement," IR Telemetrics, accessed at http://www.irtelemetrics.comconnecting_rod_strain_wireless_measurement/connecting_rod_strain_wireless_measurement.html, pp. 1-2, (2016).
Extended European Search Report and Opinion issued in connection with corresponding EP Application No. 17177902.8 dated Nov. 22, 2017.

* cited by examiner

SYSTEM FOR PISTON ROD MONITORING

BACKGROUND

The field of the disclosure relates generally to reciprocating systems and, more particularly, to a system for measuring conditions related to a piston rod.

Reciprocating systems typically include a reciprocating piston that moves axially within a cylinder and is either driven by or drives a piston rod coupled to the piston. Reciprocating systems include, for example, and without limitation, reciprocating engines, reciprocating gas compressors, integral reciprocating gas engine-compressors, i.e., motocompressors, and other reciprocating systems. In reciprocating compressors, the piston rod is coupled to a crankshaft such that rotational movement of the crankshaft, as powered by an engine or motor, is transformed into axial movement of the piston rod and piston coupled to the piston rod. The axial movement of the piston compresses gas within the cylinder. In reciprocating engines, a combustion chamber is in fluid communication with the piston and drives the piston. The piston is coupled to a piston rod moved axially by the piston. The piston rod is coupled to a crankshaft by a crosshead assembly and a connecting rod. Axial movement of the piston rod is transformed in rotational movement of the crankshaft by the geometry of the connection between the piston rod and the crankshaft provided by the connecting rod. As the piston rod experiences operational cycles fatigue loads, e.g., alternating or oscillation loads, occur in the piston rod which may result in outage of the reciprocating system. In the absence of a system to measure conditions related to the piston rod, outages of the reciprocating system may be unexpected and result in unplanned expense. Furthermore, in the absence of a system to directly measure conditions related to the piston rod, a reciprocating system cannot be accurately controlled to reduce fatigue loads or other loads on the piston rod. This limits the ability to increase the operational lifecycle of the reciprocating system and reduce unplanned outages through control of the operating conditions of the reciprocating system.

BRIEF DESCRIPTION

In one aspect, a sensor system for determining a condition of a piston rod of a reciprocating system is provided. The sensor system includes an interrogator system having a first antenna. The sensor system further includes a second antenna separated from the first antenna by an air gap distance. The second antenna is configured to be coupled to the piston rod of the reciprocating system. The second antenna is a patch antenna and is configured to communicate with the first antenna through a range of translational movement relative to the first antenna. The sensor system further includes a radio frequency sensor coupled to the second antenna. The radio frequency sensor is configured to be coupled to the piston rod of the reciprocating system, measure a characteristic associated with the piston rod of the reciprocating system, and transmit, through the second antenna, data associated with the characteristic to the first antenna of the interrogator system.

In a further aspect, a reciprocating system is provided. The reciprocating system includes a piston rod including a first end and a second end opposite the first end. A piston rod is coupled to the second end. The reciprocating system further includes a block. The piston rod extends at least partially through the block. The reciprocating system includes a sensor system for measuring a characteristic associated with the piston rod. The sensor system includes an interrogator system including a first antenna. The first antenna is coupled to an interior surface of the block. The sensor system further includes a second antenna separated from the first antenna by an air gap distance. The second antenna is coupled to the piston rod. The second antenna is a patch antenna and is configured to communicate with the first antenna through a range of translational movement relative to the first antenna. The sensor system further includes a surface acoustic wave sensor coupled to the second antenna and coupled to the piston rod. The surface acoustic wave sensor is configured to measure a strain associated with the piston rod and transmit data associated with the strain to the first antenna of the interrogator system through the second antenna.

DRAWINGS

These and other features, aspects, and advantages of the present disclosure will become better understood when the following detailed description is read with reference to the accompanying drawings in which like characters represent like parts throughout the drawings, wherein.

Figure 1:
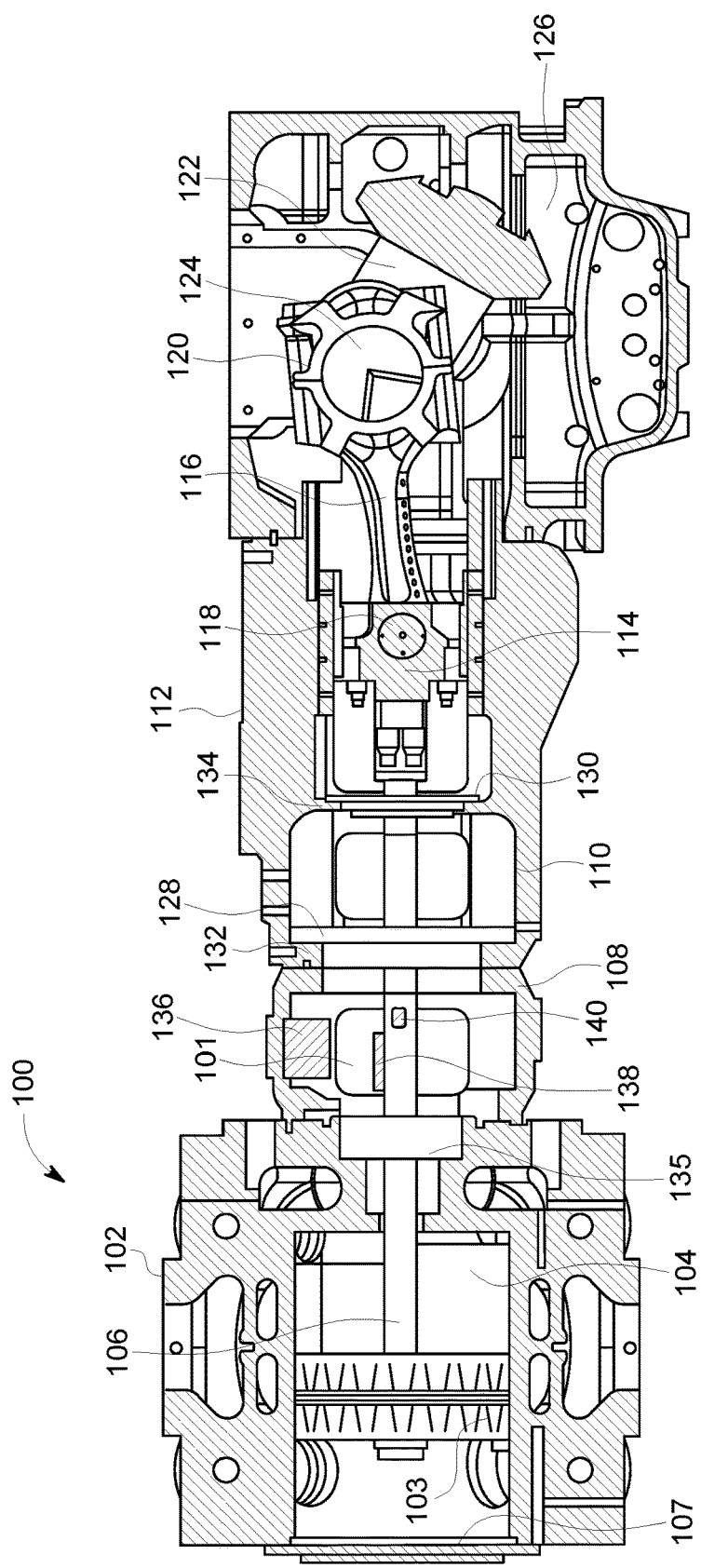
FIG. 1 is a schematic, cross-sectional view of a portion of an exemplary reciprocating system including an exemplary piston rod monitoring system.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit, and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program stored in memory for execution by personal computers, workstations, clients and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

The piston rod monitoring systems described herein provide for enhanced monitoring of a piston rod of a reciprocating system. Enhanced monitoring of a characteristic such as strain on the piston rod provides an ability to determine the condition of the piston rod such as a load on the piston rod, a stress of the piston rod, or other condition. For example, and without limitation, the monitoring system described herein or a system in communication with the monitoring system determines the condition of the piston rod based on the monitored characteristic, e.g., calculating a stress on the piston rod from a measured strain and using the geometry of the piston rod. The condition of the piston rod can include for example, and without limitation, that the piston rod is in normal condition. Monitoring of the piston rod further provides for a determination that the piston rod is not in normal condition. For example, and without limitation, the piston rod may be in a forecasted significant reduction in service life condition indicating that servicing of the piston rod or the reciprocating system is recommended to prevent or reduce the likelihood of a significant reduction in service life of the piston rod. The normal or other condition is determined, for example, and without limitation, by the piston rod monitoring system or a system in communication with the piston rod monitoring system based on one or more measured characteristics and determined conditions, e.g., the piston rod is determined to be in a normal condition if a stress calculated from a measured strain is below a predetermined threshold. Monitoring of the piston rod using the systems and methods described herein may reduce unexpected reductions in service life of one or more of the piston rod and other components of the reciprocating system.

FIG. 1 is a schematic, cross-sectional view of a portion of an exemplary reciprocating system 100 including a piston rod monitoring system 101. Piston rod monitoring system 101 is a sensor system for measuring a characteristic associated with reciprocating system 100. For example, and without limitation, piston rod monitoring system 101 measures strain of a piston rod in reciprocating system 100, a temperature, a pressure of the environment around the piston rod, piston rod deflection, torque on the piston rod, bending of the piston rod, vibration of the piston rod, or other characteristics of reciprocating system 100. Piston rod monitoring system 101 is used or is configured to determine a condition of the piston rod. For example, and without limitation, piston rod monitoring system 101 determines piston rod load by directly measuring strain of the piston rod and determining the piston rod load based on the measured strain and the characteristics of the piston rod including, for example, and without limitation, Young's modulus and the geometry of the piston rod such as the cross sectional area of the piston rod.

Reciprocating system 100 is a mechanical system including at least one portion that moves in translation and at least a second portion that moves in rotation. The rotational part drives the translational part, or the translational part drives the rotational part. For example, and without limitation, reciprocating system 100 is or includes a reciprocating engine, a reciprocating compressor, reciprocating pump, a motocompressor, hyper-compressors, fracturing pumps, e.g., for use in hydraulic fracturing, or other reciprocating system. Reciprocating system 100 includes a cylinder head 102 and a piston 103 disposed within a cylinder 104 defined within cylinder head 102. For example, and without limitation, cylinder head 102 is one or more of a cast and machined structure which defines a cavity forming cylinder 104. Cylinder head 102 includes one or more ports, channels, or other cavities defined by the structure of cylinder head 102. In some embodiments, the ports, channels, or other cavities of cylinder head 102 provide one or more compressor inlets and one or more compressor outlets. As piston 103 is driven, it draws one or more gasses into cylinder 104 through the compressor inlet(s), compresses the one or more gasses, and expels the compressed one or more gasses through the compressor outlet(s). Cylinder head 102 and the one or more ports, channels, or other cavities are configured for either single acting compression, i.e., gas is compressed only on one side of piston 103, or double acting compression, i.e., gas is alternatingly compressed on both sides of piston 103.

In alternative embodiments, the ports, channels, or other cavities provide fuel and air into cylinder 104 and evacuate exhaust from cylinder 104. Cylinder 104 provides a combustion chamber formed by a top portion 107 of cylinder head 102, cylinder 104, and piston 103. Combustion of the fuel and oxygen drives piston 103 axially within cylinder 104 during a power stroke of reciprocating system 100. Piston 103 is driven away from top portion 107. In a compression stroke, piston 103 travels toward top portion 107. In some embodiments, reciprocating system 100 is a four stroke engine including an intake stroke, the compression stroke, power stroke, and an exhaust stroke. In alternative embodiments, reciprocating system 100 is a two stroke engine.

Piston 103 is coupled to piston rod 106. For example, and without limitation, piston 103 is coupled to piston rod 106 by one or more fasteners, e.g., a nut, a weld, or piston 103 and piston rod 106 are formed, e.g., cast or machined, as a single component. Piston rod 106 extends through a first chamber 108 and a second chamber 110. First chamber 108 is a portion of block 112 and defines a cavity through which piston rod 106 extends. Second chamber 110 is a portion of block 112 and defines a further cavity through which piston rod 106 extends. In alternative embodiments, at least one of first chamber 108 and second chamber 110 are separable from block 112 and are coupled to block 112, for example, and without limitation, by fasteners such as bolts. Piston rod 106 further extends within an additional cavity defined by block 112. Piston rod 106 is coupled to crosshead assembly 114. Piston rod 106 is coupled to one end of crosshead assembly 114, for example, and without limitation, by fasteners such as bolts. The opposite end of crosshead assembly 114 is coupled to connecting rod 116 by wrist pin 118. Connecting rod 116 is coupled by bearing cap 120 to a crank throw 124 of crankshaft 122. Connecting rod 116 and bearing cap 120 form a journal bearing or other type of bearing in contact with crankshaft 122. Crankshaft 122 is contained within crankcase 126. For example, and without limitation, crankshaft 122 is supported within crankcase 126 by main bearings such as journal bearings.

Reciprocating system 100 further includes a first seal 128 and a second seal 130. First seal 128 and second seal 130 form seals with first chamber 108 and second chamber 110, respectively. First seal 128 seals with a first seat 132 to seal first chamber 108. Second seal 130 seals with a second seat 134 to seal second chamber 110. First chamber 108 and second chamber 110, along with first seal 128 and second seal 130, provide separation between cylinder 104 and other components of reciprocating system 100 including, for example, and without limitation, crosshead assembly 114, connecting rod 116, and crankshaft 122. A cylinder packing 135 further seals cylinder 104. Piston rod 106 passes through cylinder packing 135, and cylinder packing 135 forms a seal such that gasses within cylinder 104 are substantially prevented from exiting cylinder 104. Gasses that pass through cylinder packing 135 are prevented from entering other areas of reciprocating system 100 by first chamber 108 and/or second chamber 110 and their respective seals, first seal 128 and second seal 130. For example, and without limitation, one or more of first chamber 108 and second chamber 110 prevent combustion gasses or other material from exiting cylinder 104 and entering other areas of reciprocating system 100. In some embodiments, reciprocating system 100 only includes both first chamber 108 and second chamber 110 in applications where hazardous gasses are present. When hazardous gasses are not present, reciprocating system 100 only includes second chamber 110 and does not include first chamber 108. For example, and without limitation, hazardous gasses include hydrogen and hydrogen sulfide. In some embodiments, one or more of first chamber 108 and second chamber 110 along with one or more of first seal 128 and second seal 130 prevent or reduce oil or other lubricants from entering cylinder 104 from other portions of reciprocating system 100.

Piston rod monitoring system 101 is disposed, at least partially, within reciprocating system 100. For example, and without limitation, piston rod monitoring system 101 is disposed within first chamber 108. In alternative embodiments, piston rod monitoring system 100 is disposed within second chamber 110 or elsewhere within block 112.

Piston rod monitoring system 101 includes a first antenna 136 in radiofrequency communication with a second antenna 138. Second antenna 138 is coupled to a radiofrequency (RF) sensor 140. Second antenna 138 and RF sensor 140 are coupled to piston rod 106. RF sensor 140 is a sensor that measures a characteristic related to piston rod 106 and transmits information through second antenna 138. For example, and without limitation, the location of RF sensor 140 on piston rod 106 provides for direct measurement of piston rod strain, and piston rod load calculated from piston rod strain, with increased accuracy in comparison to piston rod load measuring by other systems or methods such as indirectly obtaining piston rod load through gas loads and inertia forces. In some embodiments, RF sensor 140 is a surface acoustic wave sensor. RF sensor 140 may be an all-quartz-package sensor, i.e., a sensor sealed between a quartz substrate and a second quartz layer. In alternative embodiments, RF sensor 140 is another type of sensor. For example, and without limitation, RF sensor 140 is a strain gauge, temperature sensor, e.g., a thermocouple, accelerometer, or gyroscope. RF sensor 140 is a microelectromechanical system (MEMS) sensor.

Figure 2:
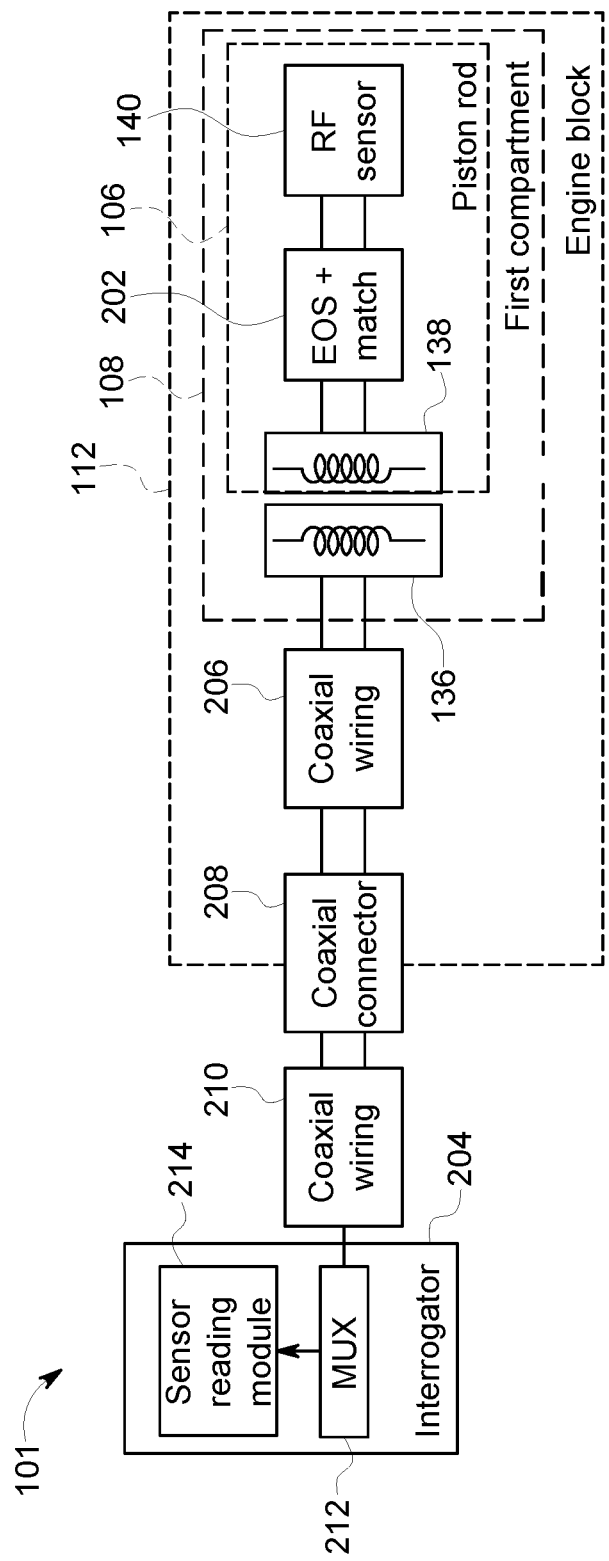
FIG. 2 is a block diagram of the piston rod monitoring system shown in FIG. 1.

FIG. 2 is a block diagram of piston rod monitoring system 101. Piston rod monitoring system 101 includes RF sensor 140 coupled to piston rod 106 for measuring a characteristic of piston rod 106. RF sensor 140 is coupled to second antenna 138 for input to RF sensor 140 and output from RF sensor 140. In some embodiments, RF sensor 140 is coupled to an electrical over-stress (EOS) and impedance matching circuit 202 positioned between RF sensor 140 and second antenna 138. EOS and impedance matching circuit 202 enhances power transmission and coupling between first antenna 136 and second antenna 138. In alternative embodiments, RF sensor 140 is coupled directly to second antenna 138. Second antenna 138 is in RF communication with first antenna 136. First antenna 136 is coupled to interrogator 204 by first coaxial wiring 206, a coaxial connector 208, and second coaxial wiring 210. Interrogator 204 interrogates RF sensor 140 by providing RF energy through first antenna 136 to second antenna 138 coupled to RF sensor 140. Interrogator 204 further receives information from RF sensor 140, transmitted by second antenna 138, using first antenna 136. Interrogator 204 includes multiplexor 212 and sensor reading module 214. Multiplexor 212 facilitates collection of information from RF sensor 140 and sensor reading module 214 analyzes or otherwise processes the information received from RF sensor 140. Interrogator 204, or a subset of components thereof, forms a data acquisition system coupled to one or more of first antenna 136 and coupled to a computing device.

In one embodiment, RF sensor 140 is a surface acoustic wave sensor. For example, and without limitation, RF sensor 140 includes a piezoelectric substrate (not shown), a first interdigitated transducer (IDT) (not shown) coupled to the piezoelectric substrate, and a second IDT (not shown) coupled to the piezoelectric substrate and separated from the first IDT by a delay line region (not shown). The first IDT receives an electrical input signal and produces an acoustic wave, e.g., a surface mechanical wave. The second IDT converts the acoustic wave to an electrical output signal through the piezoelectric effect. The characteristics of the surface on which RF sensor 140 is coupled affect the surface mechanical wave produced by RF sensor 140. For example, and without limitation, pressure, strain, torque, temperature, or other characteristics or environmental conditions affecting piston rod 106 change one or more of the length of the delay line region and the spacing between interdigitated electrodes of the first IDT and the second IDT. The electrical output signal generated by the second IDT from the surface mechanical wave is analyzed to determine characteristics of the electrical output signal such as, for example, and without limitation, phase-shift, frequency-shift, or time-delay. The electrical output signal is analyzed by sensor reading module 214 to determine the mechanical characteristics or other characteristics of piston rod 106.

RF sensor 140 receives electromagnetic energy from second antenna 138 and EOS and impedance matching circuit 202. EOS and impedance matching circuit 202 enhances power transmission and coupling between first antenna 136 and second antenna 138. In response to receiving electromagnetic energy, e.g., and without limitation, in the radio frequency spectrum, second antenna 138 provides energy to RF sensor 140. RF sensor 140 uses the received energy to generate the surface mechanical wave using the first IDT. The second IDT converts the surface mechanical wave to the electrical output signal which is transmitted by second antenna 138.

First antenna 136 receives the electrical output signal transmitted by second antenna 138. Second antenna 138 is coupled to piston rod 106 and first antenna 136 is coupled to block 112 in first chamber 108. First antenna 136 is coupled to coaxial wiring 206 that extends at least partially though block 112. Coaxial wiring 206 is coupled to coaxial connector 208 which is coupled to or extends partially through block 112. Coaxial connector 208 is coupled to coaxial wiring 210 which coupled to interrogator 204. Coaxial wiring 210, coaxial connector 208, and coaxial wiring 206 couple first antenna 136 to interrogator 204 and provide for communication of power, the electrical input signal, and the electrical output signal.

Interrogator 204 interrogates RF sensor 140 by generating the electrical input signal and transmitting the electrical input signal through coaxial wiring, coaxial connector 208, coaxial wiring 206, and first antenna 136. First antenna 136 transmits the electrical input signal as RF electromagnetic energy. Second antenna 138 receives the RF electromagnetic energy transmitted by first antenna 136 and provides the electrical input signal to RF sensor 140. RF sensor 140 uses the electrical input signal received during interrogation to generate the surface mechanical wave and generates the electrical output signal from the surface mechanical wave in response to the electrical input signal. RF sensor 140 provides the electrical output signal to second antenna 138. Second antenna 138 transmits the electrical output signal as RF electromagnetic energy that is received by first antenna 136. This occurs in response to the interrogation by interrogator 204. First antenna 136 provides the received electrical output signal to interrogator 204 through coaxial wiring 206, coaxial connector 208, and coaxial wiring 210.

Interrogator 204 includes MUX 212 and sensor reading module 214. MUX 212 multiplexes one or more of the electrical input signals and the electrical output signals. Sensor reading module 214 processes the electrical output signal to determine one or more characteristics associated with a component measured by RF sensor 140, e.g., and without limitation, piston rod 106. For example, and without limitation, sensor reading module 214 is or is included in one or more computing devices and may be implemented by a combination of one or more of software and hardware components. Software components include one or more of programs, application, processor executable code, modules, and other software components. Hardware components include memory devices such as volatile or non-volatile memory, random access memory, a hard drive, flash memory, or other hardware for storing information. Hardware components include processing devices such as a processor, a field programmable gate array, a programmable logic controller, or other hardware for processing one or more of instructions and information stored in memory or received. Hardware components may further input/output devices such as serial ports, Universal Serial Bus port, mouse, keyboard, display, or other input/output hardware.

Sensor reading module 214 determines, for example, and without limitation, strain of piston rod 106 from the electrical output signal using a calibration curve, function, equation, or formula that relates a property of the electrical output signal to strain. For example, and without limitation, the property of the electrical output signal is a phase-shift between the electrical input signal and the electrical output signal, a frequency-shift between the electrical input signal and the electrical output signal, or a time delay between the electrical input signal and the electrical output signal. In some embodiments, sensor reading module 214 can measure other characteristics such as temperature, torque, or pressure. Sensor reading module 214 determines a condition of piston rod 106. For example, and without limitation, sensor reading module 214 determines the piston rod load using a calibration curve, function, equation, or other formula that relates strain to load, e.g., and without limitation, calculating load from strain, a known Young's modulus, and a known cross-sectional area of piston rod 106. In further embodiments, sensor reading module 214 determines a condition of piston rod 106 including whether piston rod 106 is in a normal condition or is not in normal condition such as a forecasted significant reduction in service life condition. Sensor reading module 214 determines the condition, normal or not normal, based on a measured characteristic, e.g., strain, or a determined condition, e.g., stress or load. For example, and without limitation, sensor reading module 214 determines that piston rod 106 is in a normal condition by comparing a stress of piston rod 106, determined from a measured strain characteristic, to a predetermined threshold value and determining that the stress of piston rod 106 is less than the predetermined threshold value.

In alternative embodiments, piston rod monitoring system 101 includes interrogator 204 and RF sensor 140 in communication with interrogator 204. Interrogator 204 is passive and receives electrical output signal from RF sensor 140 through first antenna 136 and second antenna 138. RF sensor 140 includes a power source or is coupled to a power source also coupled to piston rod 106. For example, and without limitation, RF sensor 140 is coupled to a battery. In further alternative embodiments, one or more components of interrogator 204 are included in a computing device. For example, and without limitation, sensor reading module 214 is a program stored in memory and executed by a processor of a computing device. The computing device is coupled to a separate MUX 212 by a wired or wireless connection. Alternatively, interrogator 204 is an application specific integrated circuit that interrogates RF sensor 140. Interrogator 204 provides an output, e.g., and without limitation, a determined piston rod load or other condition, through a wired or wireless connection to a separate computing device.

Figure 3:
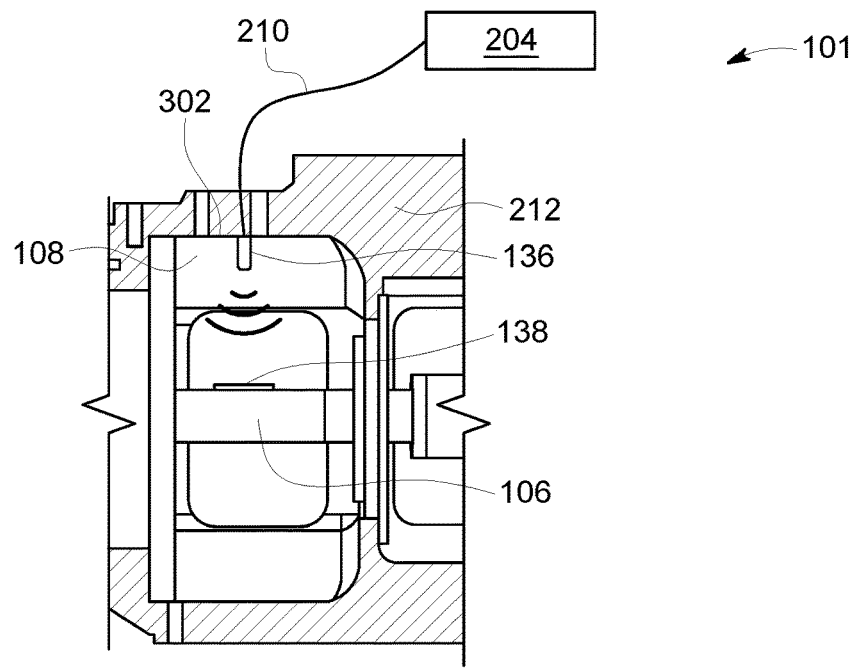
FIG. 3 is a schematic view of an exemplary first antenna and an exemplary second antenna that may be used with the piston rod monitoring system shown in FIG. 1.

FIG. 3 is a schematic view of first antenna 136 and second antenna 138 of piston rod monitoring system 101. First antenna 136 and second antenna 138 are in wireless communication, e.g., and without limitation, through transmission and reception of RF electromagnetic energy. Second antenna 138 is coupled to piston rod 106 and RF sensor 140 (shown in FIG. 2). In the exemplary embodiment, second antenna 138 is a microstrip antenna or microstrip coupler. For example, and without limitation, second antenna 138 is narrow band, wide-beam patch antenna, i.e., an antenna with a significantly greater width and length in comparison to height and a metallic antenna portion mounted to a ground plane, or other printed antenna. In some embodiments, second antenna 138 is a meander line microstrip antenna (shown in FIG. 6). As used herein, a meander line microstrip antenna is a patch antenna including, at least, conductive material such as a wire structure in a meander-line section. In the meander-line section, the conductive material is positioned as at least two sections running the width of the antenna coupled by a section running the length of the antenna. The conductive material is folded, bent, etched, or otherwise formed to create 90 degree turns that form the width sections and length sections. The overall length of the meander line microstrip antenna has a length less than the total pre-folded length of the conductive material.

Also, in the exemplary embodiment, first antenna 136 is a monopole antenna coupled to an interior wall 302 of block 112. First antenna 136 and second antenna 138 are positioned within first chamber 108 of reciprocating system 100. First antenna 136 is coupled to interrogator 204 by coaxial wiring 206 (shown in FIG. 2), coaxial connector 208 (shown in FIG. 2), and coaxial wiring 210.

In operation, piston rod 106 moves in translation relative to block 112 as piston 103 (shown in FIG. 1) and crankshaft 122 (shown in FIG. 1) drive piston rod 106. Translation of piston rod 106 results in translation of second antenna 138, coupled to piston rod 106, relative to first antenna 136. First antenna 136 and second antenna 138 communicate such that translation of second antenna 138 relative to first antenna 136 does not substantially interfere with communication between first antenna 136 and second antenna 138. Second antenna 138 is configured, as described herein, to communicate with first antenna 136 through the range of translational movement relative to first antenna 136. For example, and without limitation, the properties of one or more of first antenna 136 and second antenna 138 allow for communication at any point in the range of translation of second antenna 138, e.g., and without limitation, second antenna 138 has a range of translation equal to the stroke of piston 103, 200 millimeters (mm) plus or minus 100 mm. In alternative embodiments, the stroke of piston 103 is greater or less than 200 mm. Properties of first antenna 136 and second antenna 138 include, for example, and without limitation, antenna type, antenna geometry, beam pattern, gain, directivity, bandwidth, air gap distance between first antenna 136 and second antenna 138, or other characteristics. Stationary antennas or relatively stationary antennas, e.g., where one antenna is in rotational movement but is substantially stationary along a longitudinal axis relative to the other antenna, do not face the same difficulties maintaining communication as in an antenna system where one antenna is in translational movement relative to the antenna. For example, and without limitation, stationary antennas or relatively stationary antennas can maintain the two antennas substantially within a main lobe of the beam pattern of the transmitting antenna. This is in contrast to antennas in relative translational movement which may not remain substantially within the main lobe of the beam pattern of the transmitting antenna. Therefore, second antenna 138, as described herein, provides for communication between first antenna 136 and second antenna 138, during relative translational movement, and allows for the functions described herein.

Figure 4:
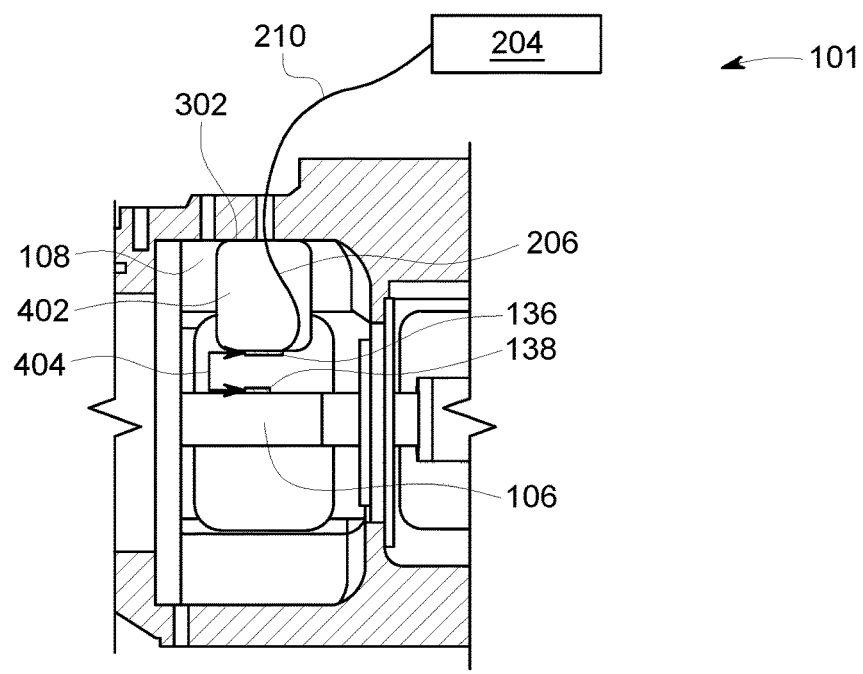
FIG. 4 is a schematic view of an alternative first antenna and an alternative second antenna that may be used with the piston rod monitoring system shown in FIG. 1.

FIG. 4 is a schematic view of alternative embodiments of first antenna 136 and second antenna 138 of piston rod monitoring system 101. First antenna 136 and second antenna 138 are in wireless communication with second antenna 138 coupled to piston rod 106. First antenna 136 is coupled to fixture 402. Fixture 402 positions first antenna 136 relative to second antenna 138 with an air gap distance 404 separating first antenna 136 and second antenna 138. Air gap distance 404 is the distance between the surface of second antenna 138 (e.g., the substrate layer in embodiments where second antenna 138 is a patch antenna) and a surface of first antenna 136 (e.g., the substrate layer of first antenna 136 in embodiments where first antenna 136 is a patch antenna). Air gap distance 404 provides for piston rod 106, and second antenna 138 coupled to piston rod 106, to translate during operation of reciprocating system 100. Air gap distance 404 allows for measurement of piston rod 106 without impeding operation of reciprocating system 100. Fixture 402 reduces air gap distance 404 such that interrogator 204 is able to interrogate RF sensor 140. Air gap distance 404 is reduced to allow for communication between first antenna 136 and second antenna 138. First antenna 136 is a microstrip antenna and second antenna 138 is a microstrip antenna. Fixture 402 is coupled to interior wall 302 of block 112 in first chamber 108 and is sized to position first antenna 136 such that air gap distance 404 is reduced, relative to first antenna 136 coupled to interior wall 302. Reducing air gap distance 404 facilitates communication between first antenna 136 and second antenna 138. One or more of first antenna 136 and second antenna 138 are sized to facilitate communication between first antenna 136 and second antenna 138. For example, and without limitation, one or more of first antenna 136 and second antenna 138 have a length that provides for at least some overlap between first antenna 136 and second antenna 138 regardless of the position of piston rod 106 in the stroke length of reciprocating system 100, i.e., the range of translational movement of second antenna 138 relative to first antenna 136. The configuration of second antenna 138, as described herein, provides for communication with first antenna 136 through the range of translational movement of second antenna 138 relative to first antenna 136.

First antenna 136 is coupled to fixture 402 and to coaxial wiring 206 that extends through or along the exterior of fixture 402. Coaxial wiring 206, coaxial connector 208

(shown in FIG. 2), and coaxial wiring 210 couple first antenna 136 to interrogator 204. Fixture 402, first antenna 136, and second antenna 138 are sized and positioned within first chamber 108 such that fixture 402, first antenna 136, and second antenna 138 do not interfere with operation of reciprocating system 100. For example, and without limitation, fixture 402, first antenna 136, and second antenna 138 are sized and positioned such that they do not interfere with movement of piston rod 106 or other components of reciprocating system 100. Fixture 402, first antenna 136, and second antenna 138 are also sized and positioned to avoid interference with other sensors or monitoring systems included in reciprocating system 100.

Figure 5:
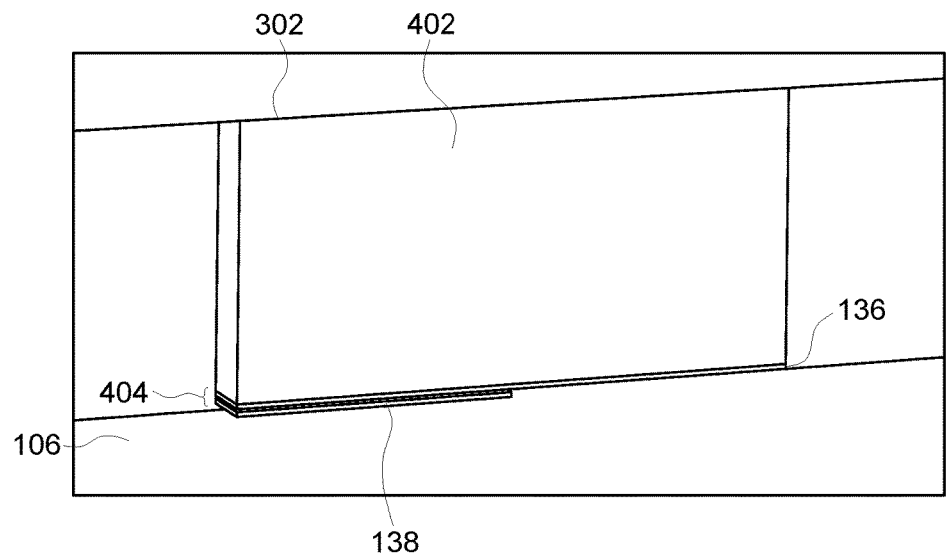
FIG. 5 is a detail isometric view of the alternative first antenna and alternative second antenna shown in FIG. 4.

FIG. 5 is a detail isometric view of first antenna 136 and second antenna 138 as shown in FIG. 4. Fixture 402 is coupled to interior wall 302 of block 112. For example, and without limitation, fixture 402 is coupled to interior wall 302 using one or more of fasteners, adhesives, welding, and other components or techniques. In some embodiments, fixture 402 is an integral component of block 112. For example, and without limitation, fixture 402 and block 112 are formed in a casting process. First antenna 136 is coupled to fixture 402 and is positioned above second antenna 138, separated by air gap distance 404. Second antenna 138 is coupled to piston rod 106. Second antenna 138 has a length half of the length of first antenna 136. First antenna 136 and second antenna 138 have the same width and height. Both first antenna 136 and second antenna 138 are microstrip antennas. Fixture 402 has a width and length equal to the width and length of first antenna 136.

In alternative embodiments, one or more of fixture 402, first antenna 136, and second antenna 138 have different sizes, geometries, configurations, or other characteristics. For example, and without limitation, second antenna 138 may have a length equal to that of first antenna 136, a length less than half of that of first antenna 136, or a length greater than that of first antenna 136. Second antenna 138 may have a width greater or less than that of first antenna 136. Similarly, fixture 402 may have dimensions other than those of first antenna 136.

Figure 6:
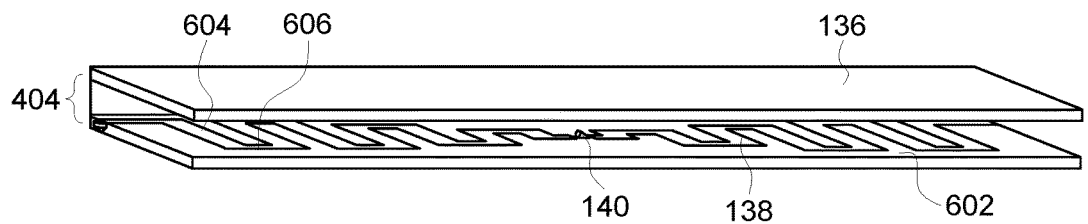
FIG. 6 is a further detail view of the alternative first antenna and alternative second antenna shown in FIG. 4.

FIG. 6 is a further detail view of first antenna 136 and second antenna 138 shown in FIG. 4 and FIG. 5. Second antenna 138 is a meander line microstrip antenna included on substrate 602. RF sensor 140 is positioned substantially at the center of substrate 602 with second antenna 138 positioned on at least two sides of RF sensor 140. Second antenna 138 includes a plurality of width segments 604 and a plurality of length segments 606. Width segments 604 run substantially the width of substrate 602. Successive width segments 604 decrease in size as they are located closer to RF sensor 140. Length segments 606 run along the length of substrate 602. Width segments 604 and length segments 606 provide greater electromagnetic discontinuity that provides more energy in electromagnetic radiation. First antenna 136 is also a meander line microstrip antenna having the same or similar configuration as that of second antenna 138. In alternative embodiments, first antenna 136 does not have successive width segments 604 that decrease in size as they approach the center of first antenna 136. Rather, successive width segments are substantially identical as first antenna 136 is not coupled to RF sensor 140. In further alternative embodiments, first antenna 136 is a microstrip antenna but not a meander line microstrip antenna. In still further alternative embodiments, first antenna 136 is an antenna type other than microstrip. For example, and without limitation, first antenna 136 is a monopole antenna.

Air gap distance 404 separates first antenna 136 and second antenna 138. Air gap distance 404 allows second antenna 138 and piston rod 106 (shown in FIG. 4) to which second antenna 138 is coupled to travel relative to first antenna 136 and fixture 402 (shown in FIG. 4) without physical contact. Air gap distance 404 is greater than 0 millimeters (mm). Fixture 402 is one or more of sized and positioned such that air gap distance 404 is between and inclusive of 5 millimeters (mm) and 20 mm. Increasing air gap distance 404 provides for greater clearance and design flexibility for components of reciprocating system 100 and piston rod monitoring system 101. The configuration of first antenna 136 and second antenna 138, as described herein, allows for air gap distance 404 to be increased while maintaining communication between first antenna 136 and second antenna 138.

In the exemplary embodiment, as air gap distance 404 is increased, the electrical output signal from second antenna 138, received at first antenna 136, decreases in magnitude relative to the electrical input signal. As described above, the electrical output signal is transmitted by second antenna 138 in response to receiving the electrical input signal transmitted from first antenna 136. The decrease in magnitude of the electrical output signal as air gap distance 404 increases constrains the air gap distance to a value at which the received electrical output signal has a sufficient magnitude to be processed by interrogator 204 (shown in FIG. 2). Air gap distance 404 is limited to a value at which first antenna 136 and second antenna 138 are able to communicate. Better coupling between first antenna 136 and second antenna 138 increases the maximum value of air gap distance 404 at which the received electrical output signal maintains sufficient magnitude for processing by interrogator 204. For example, and without limitation, use of a meander line microstrip antenna for second antenna 138 improves coupling in comparison to a straight line microstrip antenna.

In the exemplary embodiment, a meander line microstrip antenna operating between and inclusive of 400 megahertz and 450 megahertz, the magnitude of the received electrical output signal is between and inclusive of approximately −10 decibels (dB) and approximately −12 decibels dB relative to the electrical input signal when air gap distance 404 is 5 millimeters (mm). Between and inclusive of 400 megahertz and 450 megahertz, the magnitude of the received electrical output signal is between and inclusive of approximately −16 dB and approximately −17 dB relative to the electrical input signal when air gap distance 404 is 10 mm. Between and inclusive of 400 megahertz and 450 megahertz, the magnitude of the received electrical output signal is between and inclusive of approximately −19 dB and approximately −20 dB relative to the electrical input signal when air gap distance 404 is 15 mm. Between and inclusive of 400 megahertz and 450 megahertz, the magnitude of the received electrical output signal is between and inclusive of approximately −22 dB and approximately −24 dB relative to the electrical input signal when air gap distance 404 is 20 mm.

Interrogator 204 operates with an electrical output signal having a magnitude of between 0 dB and −30 dB relative to the electrical input signal. Using a meander line microstrip second antenna 138 allows for interrogator 204 to operate with an air gap distance 404 of 20 mm, as the resulting electrical output signal has a magnitude of approximately between −22 dB and −24 dB relative to the electrical input signal. This is within the range of operation of interrogator 204. In contrast, a straight microstrip second antenna 138 allows for an air gap distance 404 of between 6 mm and 8 mm to provide for an electrical output signal with a magnitude of no less than −30 dB relative to the electrical input signal as required by interrogator 204. Therefore, use of at least one meander line microstrip antenna allows for a greater air gap distance 404 that in turn allows for greater clearance between components of reciprocating system 100 and greater design flexibility of piston rod monitoring system 101.

Figure 7:
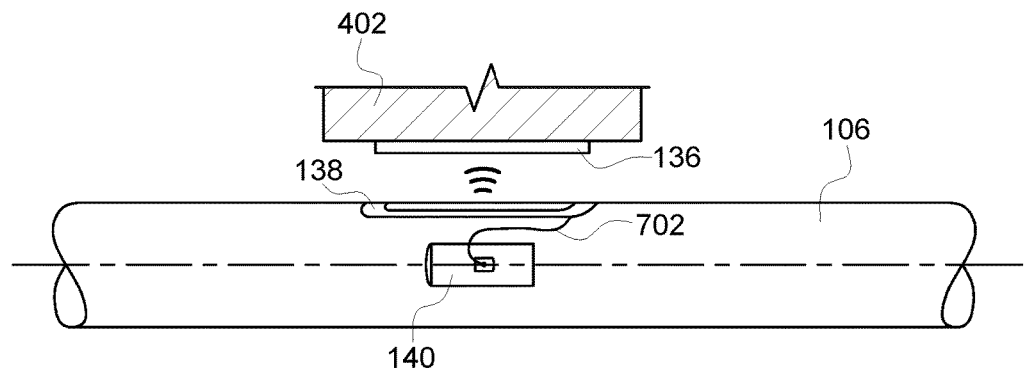
FIG. 7 is a schematic view of the piston rod monitoring system shown in FIG. 1 embedded in the piston rod shown in FIG. 1.

FIG. 7 is a schematic view of piston rod monitoring system 101 shown in FIG. 1 with second antenna 138 and RF sensor 140 embedded in piston rod 106. Second antenna 138 is positioned below first antenna 136 coupled to fixture 402. Second antenna 138 is embedded in piston rod 106. For example, and without limitation, material is removed from piston rod 106 to form a depression. Material is removed, for example, and without limitation, using a surface mill or other machining technique. Second antenna 138 is disposed within the depression and coupled to piston rod 106, e.g., and without limitation using an adhesive. In some embodiments, second antenna 138 is sealed by backfilling the depression with, for example, and without limitation, an epoxy, polymer, or other substance. In alternative embodiments, second antenna is an all-quartz-package and is coupled to piston rod 106.

RF sensor 140 is coupled to second antenna 138, for example, and without limitation, with a wired connection 702. RF sensor 140 is coupled to piston rod 106 at a location remote from second antenna 138. In some embodiments, RF sensor 140 is attached to the surface of piston rod 106. In alternative embodiments, RF sensor 140 is embedded in piston rod 106 as described with respect to second antenna 138. RF sensor 140 may be an all-quartz-package. In further alternative embodiments, RF sensor 140 is positioned substantially in the middle of second antenna 138 as described with reference to FIG. 6. RF sensor 140 and second antenna 138 are embedded in piston rod 106. In some embodiments, the combination of RF sensor 140 and second antenna 138 is a single all-quartz-package.

Figure 8:
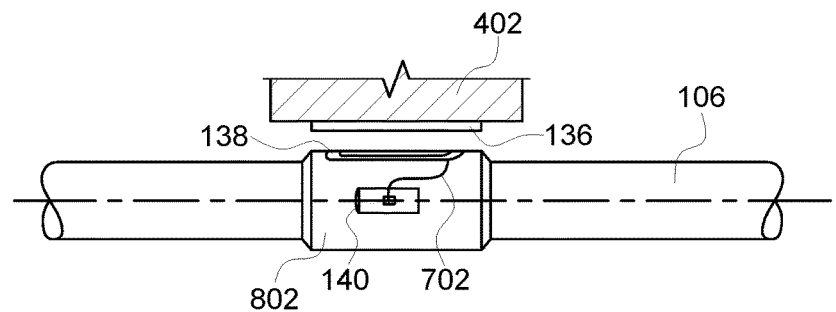
FIG. 8 is a schematic view of the piston rod monitoring system shown in FIG. 1 coupled to the piston rod shown in FIG. 1 by an exemplary sleeve.

FIG. 8 is a schematic view of piston rod monitoring system shown 101 in FIG. 1 with second antenna 138 coupled to piston rod 106 by a sleeve 802. RF sensor 140 and second antenna 138 are coupled to sleeve 802 as described with reference to FIG. 7, e.g., and without limitation by adhesives, embedded in sleeve 802, or otherwise coupled to sleeve 802. In alternative embodiments, a single all-quartz-package including second antenna 138 and RF sensor 140 positioned substantially in the middle of second antenna 138 is coupled to sleeve 802. Sleeve 802 is coupled to piston rod 106 at a position below first antenna 136 and fixture 402. In some embodiments, sleeve 802 is slid onto piston rod 106 during assembly of reciprocating system 100. Sleeve 802 is secured to piston rod 106 by an interference fit with piston rod 106, an adhesive, fasteners, or other components or techniques. In alternative embodiments, sleeve 802 includes two or more pieces and sleeve 802 is assembled around piston rod 106. For example, and without limitation, the two pieces are secured to each other by adhesive, fasteners, or other components or techniques. Sleeve 802, itself, is coupled to piston rod 106 by an interference fit with piston rod 106, an adhesive, fasteners, or other components or techniques.

Figure 9:
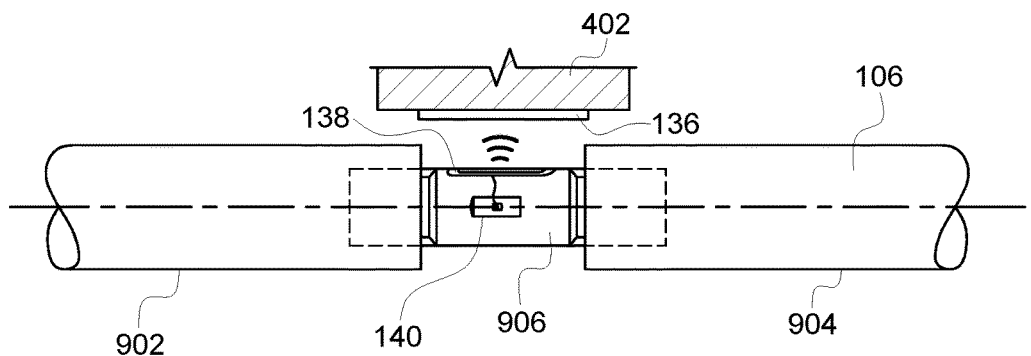
FIG. 9 is a schematic view of the piston rod monitoring system shown in FIG. 1 coupled to the piston rod shown in FIG. 1 by an exemplary joining portion.

FIG. 9 is a schematic view of the piston rod monitoring system 101 shown in FIG. 1 with second antenna 138 coupled to piston rod 106, including a first portion 902 and a second portion 904, by a joining portion 906. RF sensor 140 and second antenna 138 are coupled to joining portion 906 as described with reference to FIG. 7, e.g., and without limitation by adhesives, embedded in joining portion 906, or otherwise coupled to joining portion 906. In alternative embodiments, a single all-quartz-package including second antenna 138 and RF sensor 140 positioned substantially in the middle of second antenna 138 is coupled to joining portion 906. Joining portion 906 is coupled to piston rod 106 at a position below first antenna 136 and fixture 402. Joining portion 906 is coupled to both first portion 902 and second portion 904 of piston rod 106. In some embodiments, joining portion 906 extends within both first portion 902 and second portion 904. Joining portion 906 is secured to first portion 902 and second portion 904 using, for example, and without limitation, joining portion 906 includes a key and first portion 902 and second portion 904 both include a keyway. In alternative embodiments, joining portion 906 is coupled to first portion 902 and second portion 904 by an interference fit with first portion 902 and second portion 904, an adhesive, fasteners, or other components or techniques. In further alternative embodiments, joining portion 906 does not extend within first portion 902 and second portion 904. In some embodiments, joining portion 906 is coupled to first portion 902 and second portion 904 by welding, an adhesive, fasteners, or other components or techniques.

The above-described system provides for enhanced monitoring of a piston rod of a reciprocating system. The method and systems described herein allow for enhanced monitoring of a piston rod using an RF sensor such as an acoustic wave sensor. In some embodiments, the acoustic wave sensor is an all-quartz-package, increasing the lifetime of the RF sensor positioned within the reciprocating system by encapsulating the RF sensor. Additionally, the systems and methods described herein facilitate monitoring of a piston rod and increasing the lifetime of a monitoring system, as the RF sensor is powered by an electrical input signal transmitted wirelessly from an interrogator rather than by a battery. Also, the systems and methods described herein facilitate monitoring of a piston rod in translation during operation of the piston rod. By monitoring the piston rod using the systems and methods described herein, an operating lifetime of a reciprocating system can be increased by replacing monitored piston rods prior to a significant reduction in service life of the piston rod that may also reduce the service life of other components of the reciprocating system. Additionally, operating conditions of the reciprocating system can be changed based on monitoring of the piston rod to reduce loads on the piston rod or otherwise increase operational life of the piston rod. For example, and without limitation, the operating conditions of the reciprocating system that are controllable include crankshaft rotational speed, pressure within the cylinder, gas volume provided to the cylinder, or other operating conditions.

An exemplary technical effect of the methods, systems, and apparatus described herein includes at least one of: (a) monitoring a characteristic of a piston rod using an acoustic wave sensor; (b) wirelessly interrogating the acoustic wave sensor using an interrogator that transmits an electronic input signal; (c) generating an mechanical surface wave from the electronic input signal using the acoustic wave sensor; (d) generating an electronic output signal from the mechanical surface wave using the acoustic wave sensor; (e) transmitting the electronic output signal to the interrogator; and (0 determining a characteristic related to the piston rod based on the electronic output signal and using the interrogator.

Exemplary embodiments of method and systems for monitoring a piston rod are described above in detail. The method and systems described herein are not limited to the specific embodiments described herein, but rather, components of systems or steps of the methods may be utilized independently and separately from other components or steps described herein. For example, the systems and methods may also be used in combination with other mechanical system components, and are not limited to practice with only piston rods as described herein. Rather, the exemplary embodiments may be implemented and utilized in connection with many other components that move at least in part in translation such as pistons, connecting rods, or other components.

Although specific features of various embodiments may be shown in some drawings and not in others, this is for convenience only. In accordance with the principles of the systems and methods described herein, any feature of a drawing may be referenced or claimed in combination with any feature of any other drawing.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A sensor system for determining a condition of a piston rod of a reciprocating system, said sensor system comprising:
   an interrogator system comprising a first antenna coupled to an interior surface of a block through which the piston rod extends at least partially, said piston rod is coupled via a crosshead assembly and a connecting rod to a crank shaft disposed in a crank case of the reciprocating system, and said block is coupled to the crank case;
   a second antenna separated from said first antenna by an air gap distance, said second antenna configured to be coupled to the piston rod, wherein said second antenna is a patch antenna configured to communicate with said first antenna through a range of translational movement relative to said first antenna; and
   a radio frequency sensor coupled to said second antenna and configured to be coupled to the piston rod, said radio frequency sensor further configured to measure a characteristic associated with the piston rod and transmit, through said second antenna, data associated with the characteristic to said first antenna of said interrogator system.

2. The sensor system in accordance with claim 1, wherein said radio frequency sensor is an all-quartz-package surface acoustic wave sensor.

3. The sensor system in accordance with claim 1, wherein said first antenna is one or more of a monopole antenna and a patch antenna, and wherein said second antenna is one or more of a straight line microstrip antenna, a meander line microstrip antenna, and a monopole patch antenna.

4. The sensor system in accordance with claim 1, wherein said first antenna is a first microstrip coupler and said second antenna is a second microstrip coupler.

5. The sensor system in accordance with claim 4, wherein said second antenna is a meander line antenna.

6. The sensor system in accordance with claim 4 further comprising a fixture coupled to said first antenna, said fixture configured to be coupled to the reciprocating system and position said first antenna at said air gap distance from said second antenna.

7. The sensor system in accordance with claim 1, wherein said air gap distance is between and inclusive of 10 and 20 millimeters (mm).

8. The sensor system in accordance with claim 1, wherein the reciprocating system is one or more of a reciprocating engine, reciprocating pump, and a reciprocating compressor, wherein the characteristic measured by the radio frequency sensor is one or more of a pressure, a strain, a torque, and a temperature, wherein the sensor system is configured to determine the condition of the piston rod based on the characteristic, and wherein the condition is one or more of a piston rod load, a piston rod stress, a normal condition, and a reduction in service life condition.

9. A reciprocating system comprising:
   a piston comprising a first end and a second end opposite said first end;
   a piston rod coupled to said second end;
   a block, said piston rod extending at least partially through said block, wherein said piston rod is coupled via a crosshead assembly and a connecting rod to a crank shaft disposed in a crank case, and wherein said block is coupled to the crank case; and
   a sensor system for determining a condition associated with said piston rod, said sensor system comprising:
      an interrogator system comprising a first antenna, said first antenna coupled to an interior surface of said block;
      a second antenna separated from said first antenna by an air gap distance, said second antenna coupled to said piston rod, wherein said second antenna is a patch antenna, and wherein said second antenna is configured to communicate with said first antenna through a range of translational movement relative to said first antenna; and
      a surface acoustic wave sensor coupled to said second antenna and said piston rod, and configured to measure a strain associated with said piston rod and transmit, through said second antenna, data associated with the strain to said first antenna of said interrogator system.

10. The reciprocating system in accordance with claim 9, wherein said block defines at least one chamber, said piston rod extending through said at least one chamber, wherein said first antenna is coupled to an interior surface of said at least one chamber.

11. The reciprocating system in accordance with claim 9, wherein at least one of said second antenna and said surface acoustic wave sensor is embedded within said piston rod.

12. The reciprocating system in accordance with claim 9 further comprising a sleeve coupled to said piston rod, wherein at least one of said second antenna and said surface acoustic wave sensor are coupled to said piston rod by said sleeve.

13. The reciprocating system in accordance with claim 9, wherein said piston rod comprises a first portion and a second portion, said first portion coupled to said second portion by a joining portion extending between said first portion and said second portion, using at least one of keys and keyways, interference fit, adhesives, by welding, and fasteners, wherein one or more of said second antenna and said surface acoustic wave sensor are coupled to said joining portion.

14. The reciprocating system in accordance with claim 9, wherein said surface acoustic wave sensor is an all-quartz-package surface acoustic wave sensor.

15. The reciprocating system in accordance with claim 9, wherein said first antenna is one or more of a monopole antenna and a patch antenna, and wherein said second antenna is one or more of a straight line microstrip antenna, a meander line microstrip antenna, and a monopole patch antenna.

16. The reciprocating system in accordance with claim 9, wherein said first antenna is a monopole antenna.

17. The reciprocating system in accordance with claim 9, wherein said first antenna is a first microstrip coupler and said second antenna is a second microstrip coupler.

18. The reciprocating system in accordance with claim 17 further comprising a fixture coupled to said first antenna, said fixture configured to be coupled to the reciprocating system and position said first antenna at said air gap distance from said second antenna.

19. The reciprocating system in accordance with claim 17, wherein said second antenna is a meander line antenna.

20. The reciprocating system in accordance with claim 9, wherein said air gap distance is between and inclusive of 10 and 20 millimeters (mm).

* * * * *